(12) United States Patent
Kawashima

(10) Patent No.: US 11,430,535 B2
(45) Date of Patent: Aug. 30, 2022

(54) SEMICONDUCTOR DEVICE AND TEST METHOD THEREOF

(71) Applicant: FUJI ELECTRIC CO., LTD., Kawasaki (JP)

(72) Inventor: Tetsuya Kawashima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 25 days.

(21) Appl. No.: 16/859,798

(22) Filed: Apr. 27, 2020

(65) Prior Publication Data
US 2020/0402603 A1 Dec. 24, 2020

(30) Foreign Application Priority Data

Jun. 18, 2019 (JP) .............................. JP2019-112644
Nov. 29, 2019 (JP) .............................. JP2019-216746

(51) Int. Cl.
*G11C 29/12* (2006.01)
*G11C 29/02* (2006.01)
*G11C 29/46* (2006.01)
*G11C 29/44* (2006.01)

(52) U.S. Cl.
CPC ...... *G11C 29/12005* (2013.01); *G11C 29/021* (2013.01); *G11C 29/44* (2013.01); *G11C 29/46* (2013.01)

(58) Field of Classification Search
CPC .......................... G11C 29/12205; G11C 29/12
USPC ........................................................ 365/201
See application file for complete search history.

(56) References Cited

U.S. PATENT DOCUMENTS

| 7,266,025 B2 * | 9/2007 | Nagai ................. G06F 11/1008 365/200 |
| 2008/0016427 A1 * | 1/2008 | Namekawa ........... H03M 13/19 714/758 |
| 2008/0094898 A1 * | 4/2008 | Nakano .................. G11C 17/18 365/185.09 |
| 2010/0011266 A1 * | 1/2010 | Kurjanowicz ..... G11C 16/3454 714/735 |
| 2018/0372791 A1 | 12/2018 | Mori et al. |

FOREIGN PATENT DOCUMENTS

JP 2019-007823 A 1/2019

\* cited by examiner

*Primary Examiner* — Muna A Techane
(74) *Attorney, Agent, or Firm* — Rabin & Berdo, P.C.

(57) ABSTRACT

A semiconductor device includes an internal power supply generation circuit that generates an internal power supply voltage from an external power supply voltage and a non-volatile memory circuit. The semiconductor device sets the internal power supply voltage generated by the internal power supply generation circuit based on data stored in the non-volatile memory circuit. A mode signal that switches the internal power supply voltage is set in the non-volatile memory circuit. The mode signal is set to a burn-in mode before a burn-in test and is set to a normal mode after the burn-in test. In the burn-in test, when a VCC burn-in voltage is applied to a VCC terminal to start the semiconductor device, the internal power supply generation circuit generates a VDD burn-in voltage upon receiving the mode signal set in the burn-in mode.

14 Claims, 13 Drawing Sheets

SEMICONDUCTOR DEVICE AND TEST METHOD THEREOF

CROSS-REFERENCE TO RELATED APPLICATIONS

This application is based upon and claims the benefits of priority of the prior Japanese Patent Application No. 2019-112644, filed on Jun. 18, 2019, and the Japanese Patent Application No. 2019-216746, filed on Nov. 29, 2019, the entire contents of which are incorporated herein by reference.

BACKGROUND OF THE INVENTION

1. Field of the Invention

The embodiments discussed herein relate to a semiconductor device and a test method thereof.

2. Background of the Related Art

There is an integrated semiconductor device that includes circuits processing analog signals and circuits processing digital signals. Normally, an analog circuit operates with an external power supply voltage, and a digital circuit operates with a voltage lower than the external power supply voltage. A lower power supply voltage reduces the need to have a voltage resistance structure for the digital circuit. Thus, since wirings, etc. are reduced in size, high integration is achieved.

FIG. 13 is a block diagram illustrating a configuration example of a general semiconductor device including circuits that operate with different power supply voltages. In the following description, the name of an individual terminal and a voltage, signal, etc. at that terminal are denoted by the same reference character, as needed.

A semiconductor device 100 includes a VCC terminal serving as an external power supply terminal, an IN terminal serving as a signal input terminal, a GND terminal serving as a ground terminal, and a VDD terminal serving as an internal power supply output terminal. The semiconductor device 100 also includes an SCL terminal serving as a clock signal input terminal, an SDA terminal serving as a data input-output terminal, and an OUT terminal serving as a signal output terminal.

The semiconductor device 100 includes, for example, a VCC system control circuit 101, an internal power supply generation circuit 102, a level conversion circuit 103, a VDD system control circuit 104, and a non-volatile memory circuit 105.

The VCC terminal is connected to power supply terminals of the VCC system control circuit 101 and the internal power supply generation circuit 102. The VCC system control circuit 101 operates with a voltage VCC applied to the VCC terminal, and the internal power supply generation circuit 102 generates a voltage VDD from the voltage VCC. This voltage VDD generated by the internal power supply generation circuit 102 is supplied to the VDD terminal, the VDD system control circuit 104, and the non-volatile memory circuit 105.

The level conversion circuit 103 is disposed between the VCC system control circuit 101 and the VDD system control circuit 104 and mutually converts the signal level of the VCC system control circuit 101 and the signal level of the VDD system control circuit 104.

The non-volatile memory circuit 105 adds functions to the VDD system control circuit 104 or changes functions of the VDD system control circuit 104. The non-volatile memory circuit 105 stores data for various kinds of adjustment on functions of the VDD system control circuit 104. As needed, data is transferred from the outside via the SCL terminal and the SDA terminal.

Various tests for detecting initial failures are performed on the semiconductor device 100 at various levels. For example, tests are performed in a wafer manufacturing process, in a process of assembling chips, which are obtained by dividing a wafer into pieces, and prior to product delivery. Among these tests, there is known a burn-in test in which a voltage higher than a prescribed voltage is applied to the VCC terminal to give stress to internal circuits. This burn-in test is performed to determine whether characteristics of the internal circuit will change.

When the burn-in test is performed on a wafer, a burn-in test apparatus is connected to the VCC terminals, the VDD terminals, and the GND terminals of the individual semiconductor devices 100 on the wafer. In this case, depending on the circuit configuration of the individual semiconductor devices 100, additional circuits need to be arranged so that the application of a burn-in voltage will not cause defects. There is known a semiconductor device that enables a test without such an additional circuit for the burn-in test (for example, see Japanese Laid-open Patent Publication No. 2019-007823).

This semiconductor device in Japanese Laid-open Patent Publication No. 2019-007823 includes an external connection terminal that enables application of a gate screening voltage when a gate screening test is performed on a voltage-control type semiconductor element. When a gate screening test is performed, by applying the gate screening voltage to the external connection terminal, an operation of a circuit connected a gate of the voltage-control type semiconductor element is forcibly disabled.

However, burn-in test apparatuses have a limited number of wirings that are connectable to a wafer to be tested. In addition, since the operators wish to test as many semiconductor devices as possible in a single test, it is desirable that as few test terminals as possible be used.

In addition, in the case of the above semiconductor device, the different burn-in voltages need to be applied to the VCC and VDD terminals, the burn-in test apparatus needs to include power supply circuits capable of generating these burn-in voltages.

SUMMARY OF THE INVENTION

According to one aspect of the embodiments, there is provided a semiconductor device having an external power supply terminal, the semiconductor device including an internal power supply generation circuit configured to generate an internal power supply voltage from the external power supply voltage applied to an external power supply terminal, and a non-volatile memory circuit configured to store therein data rewritable externally. The internal power supply generation circuit sets the internal power supply voltage based on the data stored in the non-volatile memory circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
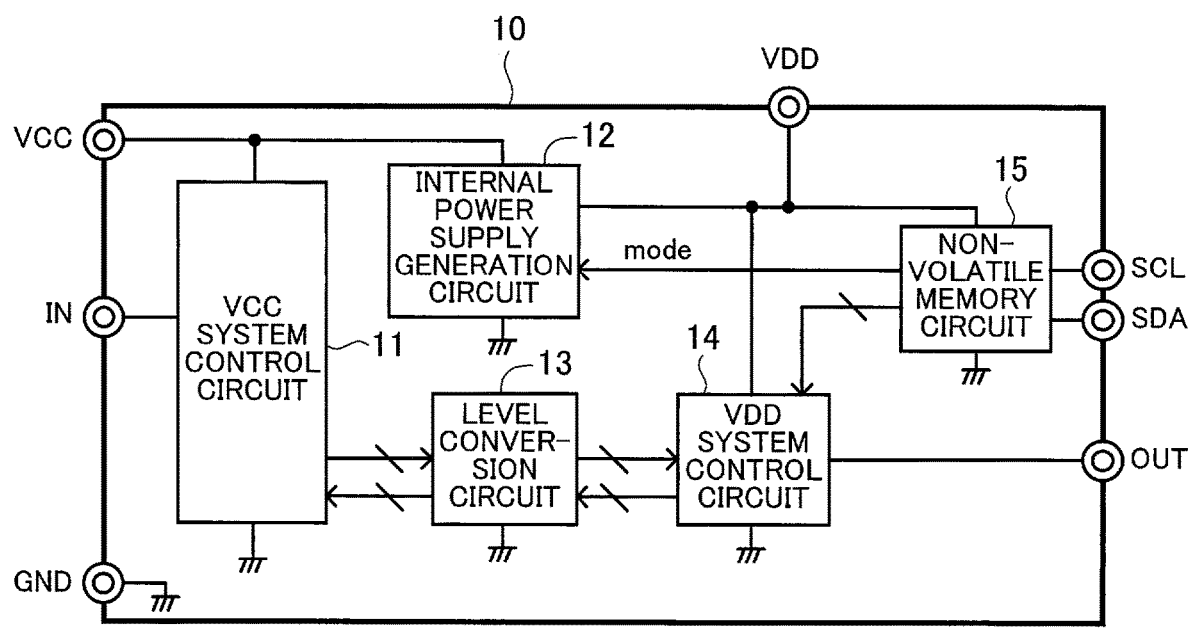
FIG. 1 is a block diagram illustrating a configuration example of a semiconductor device according to a first embodiment.

Embodiments will hereinafter be described in detail with reference to the accompanying drawings, wherein like reference characters refer to like elements throughout. In addition, an individual embodiment may be implemented by partially combining a plurality of embodiments, as long as the combination does not cause contradiction.

Figure 2:
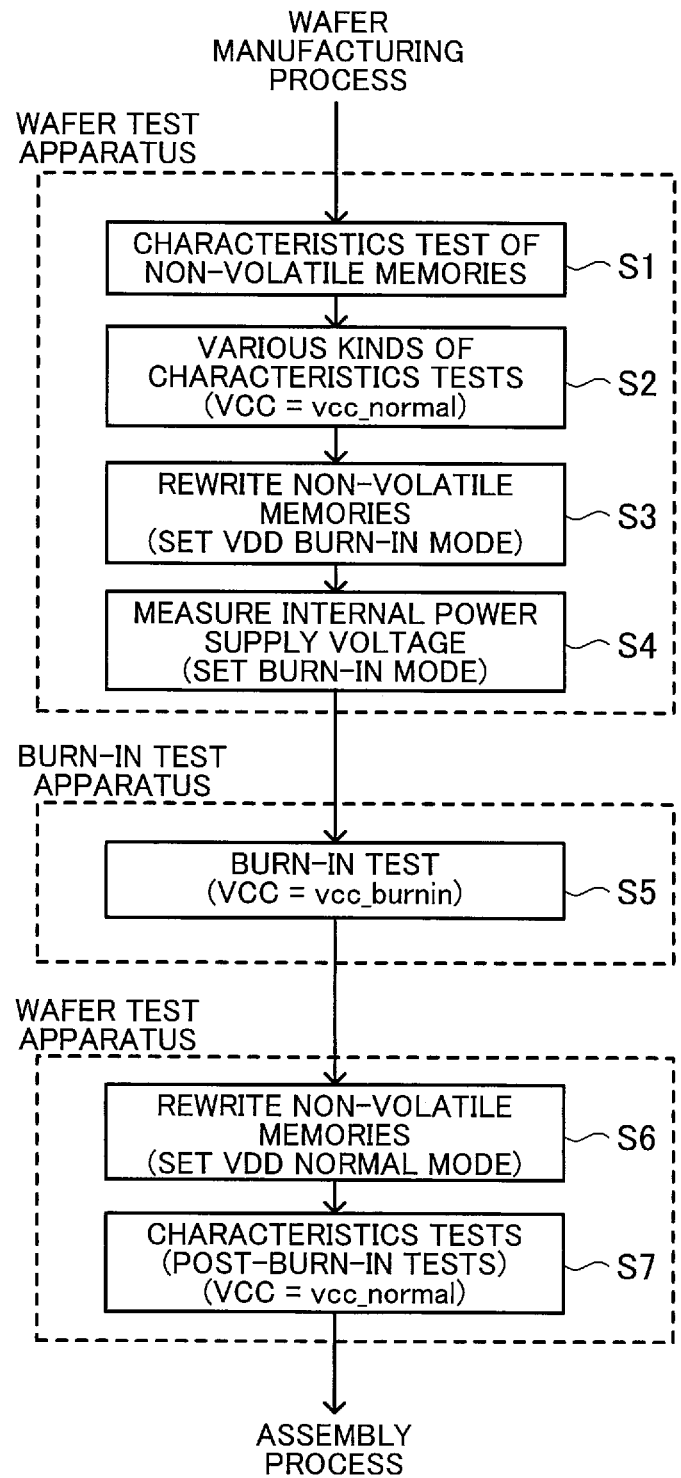
FIG. 2 illustrates an example of a procedure of a method for performing a burn-in test on the semiconductor device according to the first embodiment.

FIG. 1 is a block diagram illustrating a configuration example of a semiconductor device according to a first embodiment. FIG. 2 illustrates an example of a procedure of a method for performing a burn-in test on the semiconductor device according to the first embodiment.

A semiconductor device 10 according to the first embodiment includes a VCC terminal serving as an external power supply terminal, an IN terminal serving as a signal input terminal, a GND terminal serving as a ground terminal, and a VDD terminal serving as an internal power supply terminal. The semiconductor device 10 also includes an SCL terminal serving as a clock signal input terminal, an SDA terminal serving as a data input-output terminal, and an OUT terminal serving as a terminal that outputs a signal processed by this semiconductor device 10. The VDD terminal, the SCL terminal, and the SDA terminal are used for measuring or adjusting characteristics in a screening test or the like.

The semiconductor device 10 includes a VCC system control circuit 11, an internal power supply generation circuit 12, a level conversion circuit 13, a VDD system control circuit 14, and a non-volatile memory circuit 15 and has a circuit configuration that operates with two power supply voltages VCC and VDD. It is desirable that the non-volatile memory circuit 15 be a non-volatile memory that is rewritable a plurality of times. For example, as the non-volatile memory, an electrically erasable and programmable read-only memory (EEPROM) or a flash memory may be used.

The VCC system control circuit 11 is an analog circuit that operates with an external power supply voltage VCC supplied to the VCC terminal and that processes a signal inputted to the IN terminal, for example. Herein, the voltage VCC is 5 volts (V), for example.

The internal power supply generation circuit 12 generates an internal power supply voltage VDD from the external voltage VCC supplied to the VCC terminal and supplies the generated voltage VDD to the VDD system control circuit 14 and the non-volatile memory circuit 15. Herein, the voltage VDD is 3.3 V, for example.

The level conversion circuit 13 converts the signal level of the VCC system control circuit 11 into the signal level of the VDD system control circuit 14. The level conversion circuit 13 also converts the signal level of the VDD system control circuit 14 into the signal level of the VCC system control circuit 11.

For example, a value outputted by a physical amount sensor is used as the signal inputted to the IN terminal. If a physical amount sensor is integrated on the semiconductor device 10, the semiconductor device 10 may be configured without the IN terminal by connecting the physical amount sensor and the input terminal of the VCC system control circuit 11 to each other via internal wirings.

For example, the VDD system control circuit 14 and the non-volatile memory circuit 15 are digital circuits. The non-volatile memory circuit 15 adds functions to the VDD system control circuit 14 or changes functions of the VDD system control circuit 14. The non-volatile memory circuit 15 stores data for various kinds of adjustment on functions of the VDD system control circuit 14 and a mode signal mode for setting or cancelling a burn-in mode in the internal power supply generation circuit 12.

Before a burn-in test is performed, this semiconductor device 10 rewrites a mode signal mode stored in the non-volatile memory circuit 15 from a normal mode to the burn-in mode by using a clock signal inputted to the SCL terminal and data inputted to the SDA terminal.

When a burn-in test is performed, the internal power supply generation circuit 12 receives the mode signal mode stored in the non-volatile memory circuit 15 and is set in the burn-in mode. Consequently, for example, when 7.8 V is applied as a VCC burn-in voltage to the VCC terminal in the burn-in test, the internal power supply generation circuit 12 generates, for example, 4.5 V as a VDD burn-in voltage. In this state, aging is performed with the VCC burn-in voltage on the VCC system control circuit 11 for a predetermined period. Simultaneously, aging is performed with the VDD burn-in voltage on the VDD system control circuit 14 and the non-volatile memory circuit 15 for a predetermined period. Namely, only by applying the VCC burn-in voltage to the VCC terminal of the semiconductor device 10, the VDD burn-in voltage is applied to the VDD system control circuit 14 and the non-volatile memory circuit 15. Thus, more semiconductor devices 10 are tested on a single burn-in test since the burn-in test apparatus does not need wirings for applying the VDD burn-in voltage to the individual VDD terminals.

After the burn-in test is performed, the mode signal mode stored in the non-volatile memory circuit 15 is rewritten from the burn-in mode to the normal mode, and the internal power supply generation circuit 12 is set back to the normal mode. Next, when 5 V is applied as the voltage VCC to the VCC terminal to start the semiconductor device 10, the internal power supply generation circuit 12 generates the prescribed 3.3 V as the voltage VDD. In this way, the internal power supply generation circuit 12 sets the internal power supply voltage based on the data stored in the non-volatile memory circuit 15.

Next, a procedure of a method for performing a burn-in test on the individual semiconductor devices 10 will be described. The following description will be made with reference to FIG. 2 based on an example in which a burn-in test is performed on a wafer including the semiconductor devices 10.

First, when a wafer is manufactured, the wafer is moved to a wafer test apparatus, and a characteristics test is performed on the individual non-volatile memories (step S1). If the wafer test apparatus checks that the characteristics of the non-volatile memories are normal, the wafer test apparatus applies a normal mode voltage vcc_normal to each of the VCC terminals and performs various kinds of characteristics tests on the semiconductor devices 10 (step S2).

Next, by using the SCL and SDA terminals, the wafer test apparatus rewrites the mode signal mode stored in the individual non-volatile memory circuit 15 from the normal mode to the burn-in mode and sets the VDD burn-in mode (step S3).

Next, the wafer test apparatus measures the voltage at the individual VDD terminal and checks that the individual internal power supply generation circuit 12 is generating 4.5 V as the VDD burn-in voltage (step S4). If the individual internal power supply generation circuit 12 is generating 4.5 V as the VDD burn-in voltage, the wafer test apparatus determines that the individual semiconductor device 10 has been set in the burn-in mode.

Next, the wafer whose semiconductor devices 10 have been set in the burn-in mode is moved to a burn-in test apparatus, and a burn-in test is performed (step S5). Specifically, the burn-in test apparatus applies a burn-in mode voltage vcc_burnin to the VCC terminal of the individual semiconductor device 10 and continues this application of the voltage vcc_burnin for a predetermined period. Consequently, in the test period, the individual VCC system control circuit 11 is operated with 7.8 V as the voltage vcc_burnin higher than 5 V as the normal voltage VCC, and the VDD system control circuit 14 and the non-volatile memory circuit 15 are operated with 4.5 V higher than 3.3 V as the normal voltage VDD.

After the burn-in test, the wafer is returned to the wafer test apparatus, and the wafer test apparatus rewrites the mode signal mode stored in the non-volatile memory circuit 15 from the burn-in mode to the normal mode and sets the VDD normal mode (step S6). Next, the wafer test apparatus applies the normal mode voltage vcc_normal to the VCC terminals of the respective semiconductor devices 10 and performs characteristics tests, which are post-burn-in tests, on the semiconductor devices 10 (step S7). If the wafer passes these post burn-in tests, the wafer is moved to an assembly process.

In the assembly process, the wafer is divided into individual semiconductor chips (individual semiconductor devices 10), and these semiconductor devices 10 are incorporated in containers that are formed by, for example, resin or ceramic material and that have lead terminals.

Figure 3:
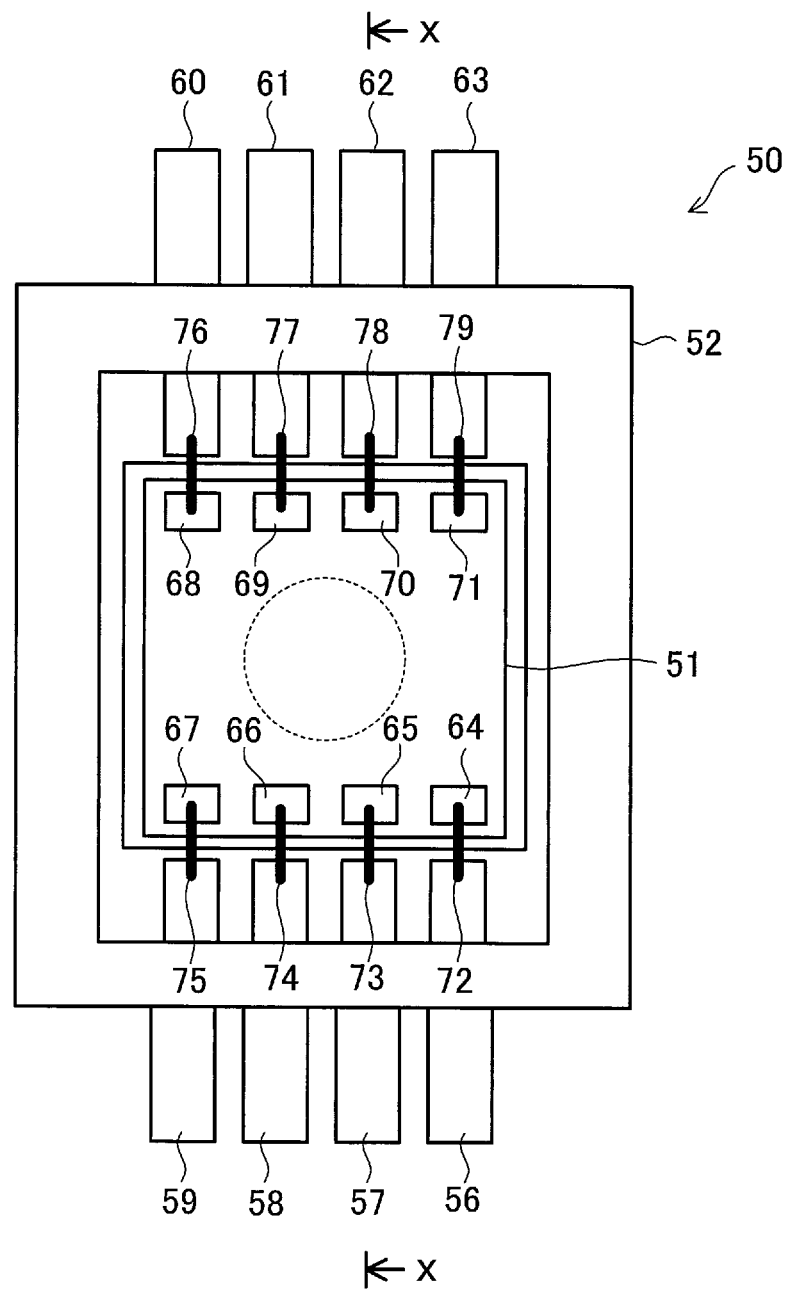
FIG. 3 is a plan view illustrating an example of a pressure sensor apparatus obtained by incorporating a pressure sensor chip as an individual semiconductor device into a resin case.
Figure 4:
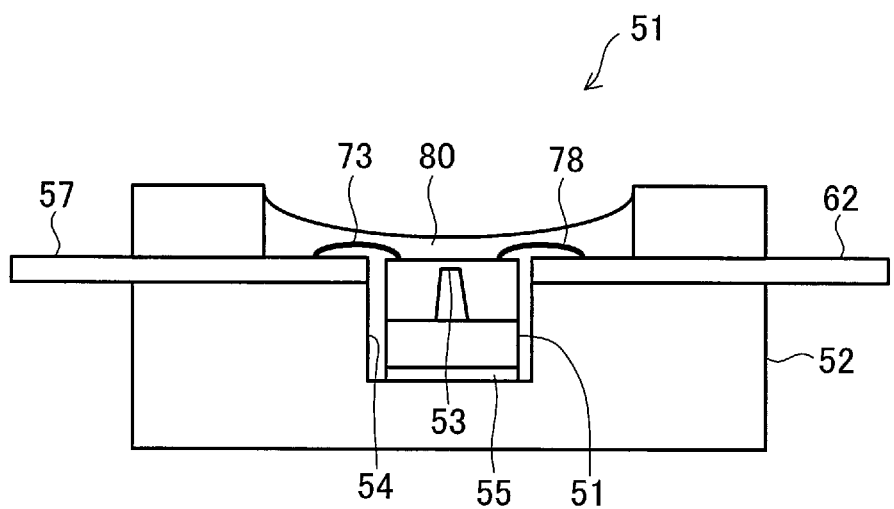
FIG. 4 is a sectional view taken along a line x-x in FIG. 3.

FIG. 3 is a plan view illustrating an example of a pressure sensor apparatus obtained by incorporating a pressure sensor chip as an individual semiconductor device into a resin case. FIG. 4 is a sectional view taken along a line x-x in FIG. 3. In FIG. 3, the semiconductor pressure sensor chip is exposed.

A pressure sensor apparatus 50 is formed by incorporating a pressure sensor chip 51 into a resin case 52. The pressure sensor chip 51 includes a diaphragm 53 and a glass base. The diaphragm 53 is formed by thinning approximately the center portion of the silicon substrate, and a strain gauge not illustrated is disposed on the pressure reception surface. The resin case 52 is formed by thermoset resin such as epoxy resin or thermoplastic resin such as polyphenylene sulfide resin or polybutylene terephthalate resin. A sensor mounting concave portion 54 is formed in the center portion of the resin case 52. The pressure sensor chip 51 is bonded to the sensor mounting concave portion 54 by adhesive agent 55. In addition, the resin case 52 integrally includes externally connected lead terminals 56 to 63, which are formed by insert molding in such a manner that the lead terminals 56 to 63 extend through the resin case 52. These lead terminals 56 to 63 are electrically connected to bonding pads 64 to 71 of the pressure sensor chip 51 via bonding wires 72 to 79. The surface of the pressure sensor chip 51 and the bonding wires 72 to 79 are protected by gelatinous protection material 80. The protection material 80 transfers measured pressure to the pressure sensor chip 51 while providing protection from, for example, contaminants included in the medium from which the measured pressure is obtained.

In the example in FIG. 3, the pressure sensor chip 51 includes the eight bonding pads 64 to 71. Herein, as an example, the first bonding pad 64 is a pad for sensor detection and output, the second bonding pad 65 is a pad for inputting the voltage VCC, and the third bonding pad 66 is a ground pad. The fourth to eight bonding pads 67 to 71 are terminals used for, for example, sensitivity adjustment of the pressure sensor apparatus 50. The number of lead terminals and the number of bonding pads used for, for example, sensitivity adjustment of the pressure sensor apparatus 50 are not limited to 5. Four or fewer lead terminals and four or fewer bonding pads may alternatively be used. Still alternatively, six or more lead terminals and six or more bonding pads may be used.

While a case where the semiconductor device 10 is applied to a pressure sensor chip has been described, the semiconductor device 10 is also similarly applicable to a physical amount sensor chip other than a pressure sensor chip. The semiconductor device 10 is also applicable to a semiconductor device that does not include a physical amount sensor chip.

Figure 5:
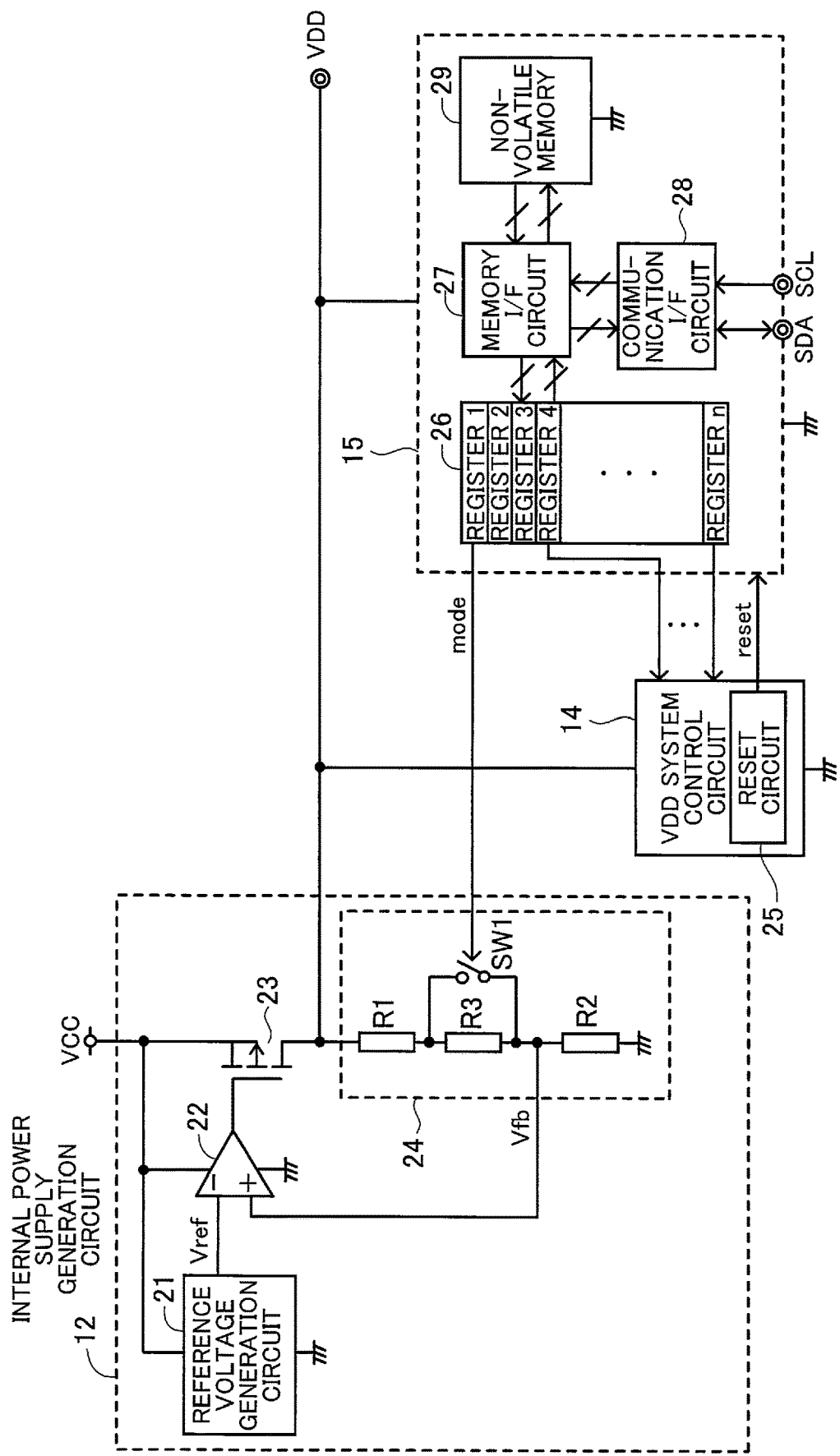
FIG. 5 is a circuit diagram illustrating specific configuration examples of an internal power supply generation circuit and a non-volatile memory circuit in the semiconductor device according to the first embodiment.
Figure 6B:
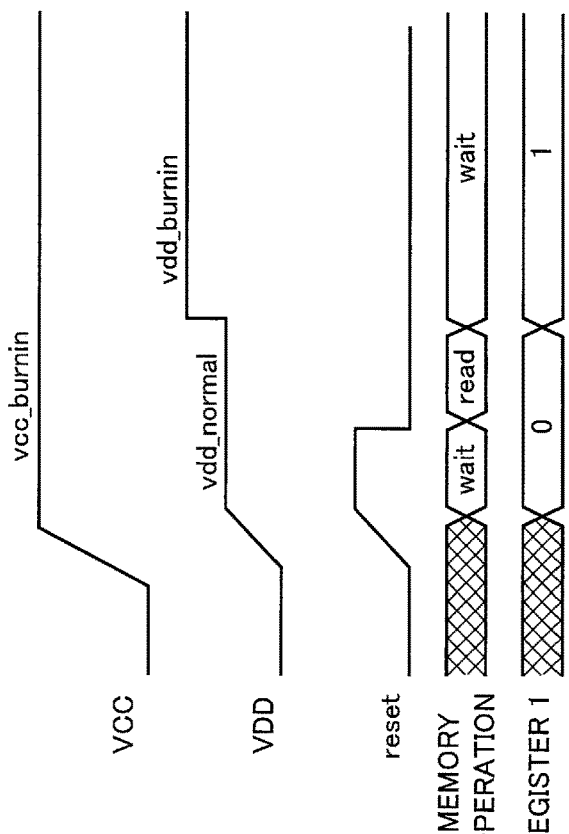
FIGS. 6A and 6B are sequence diagrams illustrating operations when the semiconductor device according to the first embodiment is started (FIG. 6A illustrates a normal mode, and FIG. 6B illustrates a burn-in mode)
Figure 6A:
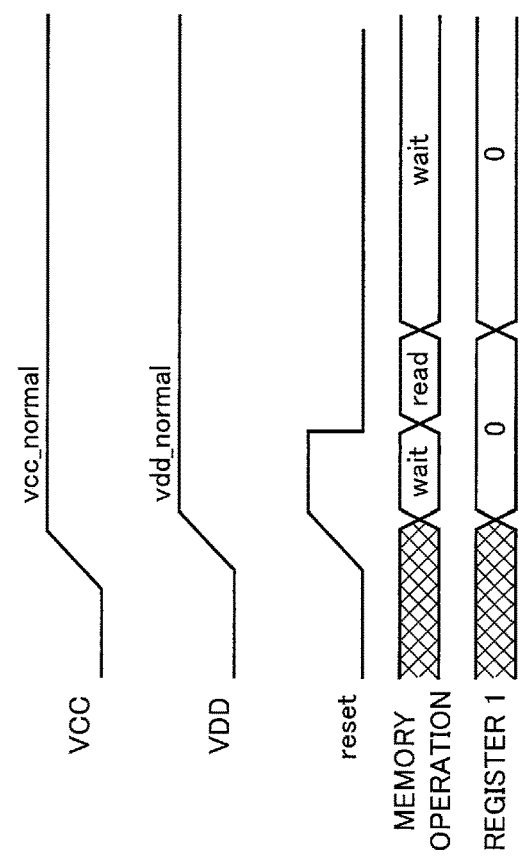
Figure 7:
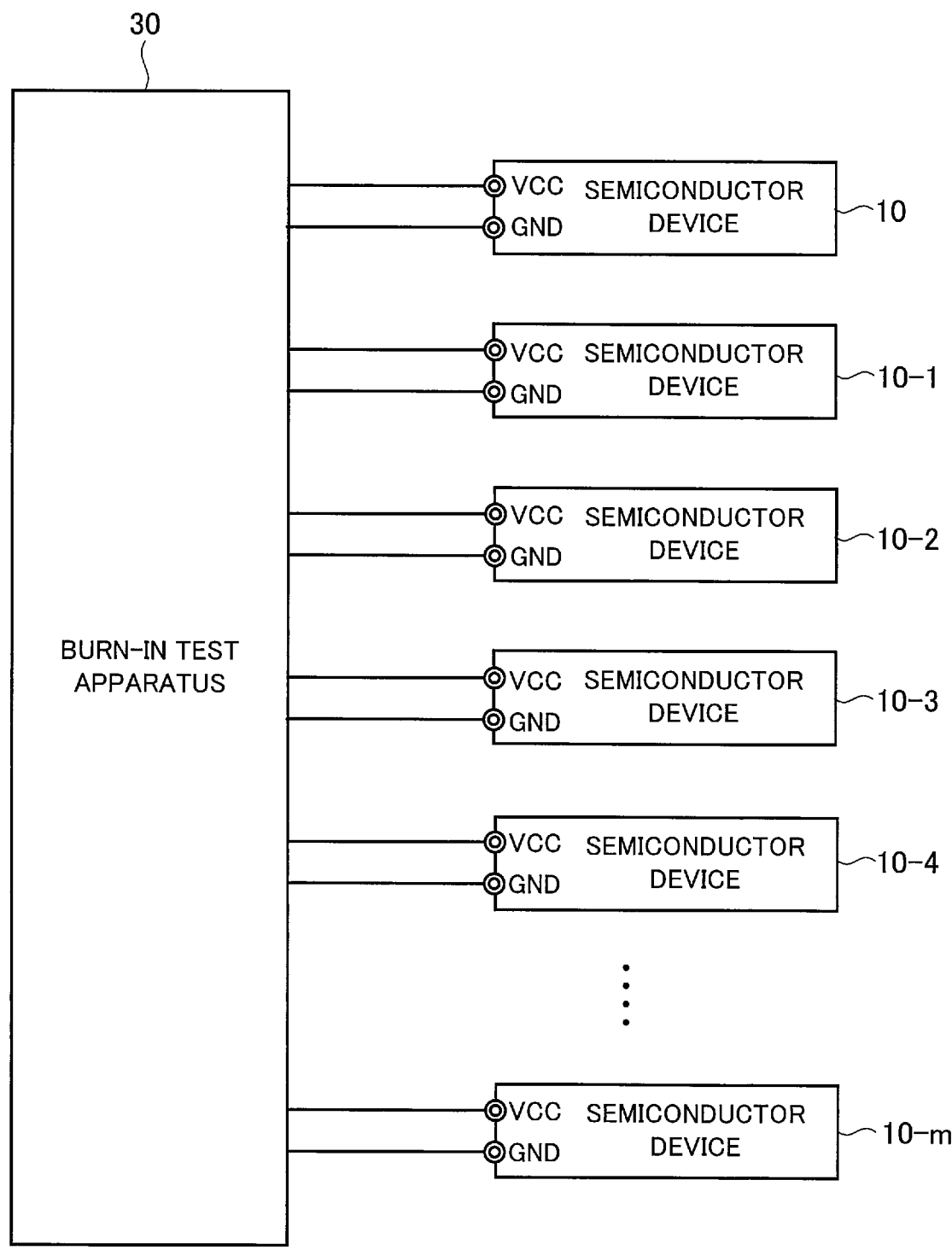
FIG. 7 illustrates advantageous effects of the embodiment.

FIG. 5 is a circuit diagram illustrating specific configuration examples of the internal power supply generation circuit and the non-volatile memory circuit in the semiconductor device according to the first embodiment. FIGS. 6A and 6B are sequence diagrams illustrating operations when the semiconductor device according to the first embodiment is started (FIG. 6A illustrates a normal mode, and FIG. 6B illustrates a burn-in mode). FIG. 7 illustrates advantageous effects of the embodiment.

The internal power supply generation circuit 12 includes a reference voltage generation circuit 21, an error amplifier 22, an output transistor 23, and an internal power supply voltage setting circuit 24 including resistors R1 to R3 and a switch SW1. In FIG. 5, while a P-channel metal-oxide-semiconductor field-effect transistor (MOSFET) is used as the output transistor 23, a different kind of transistor may alternatively be used.

The reference voltage generation circuit 21 has a high potential terminal connected to the VCC terminal and a low potential terminal connected to ground and generates and outputs a certain voltage from the voltage VCC as a reference voltage Vref. The error amplifier 22 has an inverting input terminal that receives the reference voltage Vref generated by the reference voltage generation circuit 21 and has an output terminal connected to the gate terminal of the output transistor 23. The output transistor 23 has a source terminal connected to the VCC terminal and a drain terminal connected to the internal power supply voltage setting circuit 24 and the VDD terminal. In the internal power supply voltage setting circuit 24, one terminal of the resistor R1 is connected to the drain terminal of the output transistor 23 and the VDD terminal, and the other terminal of the resistor R1 is connected to one terminal of the resistor R3 and one terminal of the switch SW1. The other terminal of the resistor R3 and the other terminal of the switch SW1 are connected to the non-inverting input terminal of the error amplifier 22 and one terminal of the resistor R2, and the other terminal of the resistor R2 is connected to ground. In this way, the internal power supply generation circuit 12 forms a linear regulator.

The VDD system control circuit 14 has a high potential terminal connected to the VDD terminal and has a low potential terminal connected to ground and includes a reset circuit 25. While this reset circuit 25 is disposed in the VDD system control circuit 14 in this first embodiment, the reset circuit 25 may be incorporated in a different circuit or disposed independently in the semiconductor device 10. A reset signal reset outputted by the reset circuit 25 is outputted when the semiconductor device 10 is started, for example. After the voltage of the VDD terminal rises to a predetermined voltage and becomes sufficiently stable, this reset signal reset is canceled.

The non-volatile memory circuit 15 has a high potential terminal connected to the VDD terminal and a low potential terminal connected to ground and includes a register circuit 26, a memory interface (I/F) circuit 27, a communication interface circuit 28, and a non-volatile memory 29.

The register circuit 26 includes n registers, and the output of a register 1 of these n resisters is connected to the control input terminal of the switch SW1 in the internal power supply voltage setting circuit 24, and a value stored in the register 1 in the register circuit 26 is supplied to the switch SW1 as the mode signal mode. Values stored in the register 4 to the register n are supplied to the VDD system control circuit and are used for, for example, fine adjustment of internal functions in the VDD system control circuit 14.

The register circuit 26 is connected to the non-volatile memory 29 via the memory interface circuit 27. By controlling the non-volatile memory 29, the memory interface circuit 27 reads data stored in the non-volatile memory 29 and writes the data in the register circuit 26. The memory interface circuit 27 is connected to the communication interface circuit 28. The communication interface circuit 28 converts an externally given communication signal into data to be stored in the register circuit 26 and the non-volatile memory 29. The communication interface circuit 28 also converts data stored in the register circuit 26 and the non-volatile memory 29 into a communication signal and outputs the communication signal.

Herein, in the internal power supply generation circuit 12, the inverting input terminal of the error amplifier 22 receives the reference voltage Vref, and the non-inverting input terminal of the error amplifier 22 receives a feedback voltage Vfb, which is obtained by dividing the voltage VDD by using the resistors R1 to R3. The error amplifier 22 compares the reference voltage Vref with the feedback voltage Vfb and controls the output transistor 23 in such a manner that the difference will be zero. The error amplifier 22 maintains the voltage VDD at a constant value. The internal power supply voltage setting circuit 24 that generates the feedback voltage Vfb is configured such that the resistor R3 that determines switching of the voltage division ratio for the voltage VDD may be short-circuited by the switch SW1. When the switch SW1 receives the mode signal mode indicating the normal mode from the register 1 in the register circuit 26, the switch SW1 is set in a closed (on) state. When the switch SW1 receives the mode signal mode indicating the burn-in mode, the switch SW1 is set in an open (off) state. Thus, in the normal mode, the feedback voltage Vfb is determined by the voltage division ratio based on the value of the resistor R1 and the value of the resistor R2 (R2/(R1+R2)). The feedback voltage Vfb in the burn-in mode is determined by the voltage division ratio based on the sum of the values of the resistors R1 and R3 and the value of the resistor R2 (R2/(R1+R3+R2)). The voltage division ratio in the burn-in mode is smaller than the voltage division ratio in the normal mode, and the feedback voltage Vfb is accordingly lower in the burn-in mode. Since the error amplifier 22 controls the output transistor 23 to match the lower feedback voltage Vfb to the reference voltage Vref, the voltage VDD in the burn-in mode becomes higher than the voltage VDD in the normal mode.

When the semiconductor device 10 is started, whether the mode signal mode is the normal mode or the burn-in mode is determined, and the switch SW1 is controlled based on the determination result. Hereinafter, the corresponding operation sequences will be described.

First, when the mode signal mode indicating the normal mode is set in the non-volatile memory 29 and when the normal mode voltage is applied to the VCC terminal, the voltage at the VDD terminal and the voltage at the reset signal reset rise with the increase of the voltage of the VCC terminal, as illustrated in FIG. 6A.

Next, when the voltage at the VCC terminal reaches the normal mode voltage vcc_normal and becomes stable, the voltage at the VDD terminal is set to a normal mode voltage vdd_normal. The reset signal reset is maintained at the same voltage level as the voltage vdd_normal. While this reset signal reset is maintained at the same voltage level as the voltage at the VDD terminal, the memory operations of the register circuit 26 and the non-volatile memory 29 are set in a wait state.

When the reset circuit 25 detects that at least one of the voltages at the VCC terminal and the VDD terminal is equal to or more than a predetermined voltage and when a certain period of time elapses, the reset circuit 25 changes the reset signal reset to a low "L" level and cancels the reset signal reset. Accordingly, since the reset signal reset is canceled, the non-volatile memory circuit 15 starts its operation. In the non-volatile memory circuit 15, the memory interface circuit 27 performs a read operation of reading out the contents of the individual addresses of the non-volatile memory 29 to the respective registers in the register circuit 26. Since the content of the address of the non-volatile memory 29 read out to the register 1 in the register circuit 26 is "L" in the normal mode, the mode signal mode read out to the register 1 is also an "L" level. In this case, the switch SW1 is set in a closed state. Thus, in the normal mode, the voltage vcc_normal is applied to the VCC terminal, the voltage at the VDD terminal is set to the voltage vdd_normal. After the memory interface circuit 27 reads out the contents of the individual addresses of the non-volatile memory 29 to the register circuit 26 and stores the contents in the individual registers, the memory operations of the register circuit 26 and the non-volatile memory 29 are set in the wait state.

Next, when the mode signal mode indicating the burn-in mode is set in the non-volatile memory 29 and when the burn-in mode voltage vcc_burnin is applied to the VCC terminal, the voltage at the VDD terminal and the voltage at the reset signal reset rise to the voltage vdd_normal with the increase of the voltage at the VCC terminal, as illustrated in FIG. 6B.

Next, when the voltage at the VCC terminal reaches the burn-in mode voltage vcc_burnin and becomes stable, the voltage at the VDD terminal is set to the normal mode voltage vdd_normal. The reset signal reset is maintained at the same voltage level as the voltage vdd_normal. While this reset signal reset is maintained at the same voltage level as the voltage at the VDD terminal, the memory operations of the register circuit 26 and the non-volatile memory 29 are set in the wait state.

When the reset circuit 25 changes the reset signal reset to the "L" level and cancels the reset signal reset supplied to the non-volatile memory circuit 15, the memory interface circuit 27 performs a read operation of reading out the contents of the individual addresses of the non-volatile memory 29 to the respective registers in the register circuit 26. Since the content of the non-volatile memory 29 read out to the register 1 in the register circuit 26 is "H" in the burn-in mode, the mode signal mode is also at an "H" level. In this case, the switch SW1 is set in an open state. Thus, in the burn-in mode, the voltage vcc_burnin is applied to the VCC terminal, and the voltage at the VDD terminal is switched from the voltage vdd_normal to the voltage vdd_burnin and is set to the voltage vdd_burnin. After the memory interface circuit 27 reads out the contents of the individual addresses of the non-volatile memory 29 to the register circuit 26 and stores the contents in the respective registers, the memory operations of the register circuit 26 and the non-volatile memory 29 are set in the wait state. In this way, the voltage at the VDD terminal is set to the burn-in mode voltage vdd_burnin.

As described above, when a burn-in test is performed, the internal power supply generation circuit 12 of the semiconductor device 10 reads the mode signal mode previously set in the non-volatile memory circuit 15 and generates the burn-in mode voltage vdd_burnin.

Thus, as illustrated in FIG. 7, a burn-in test apparatus 30 only needs to be connected to the VCC terminals and the GND terminals of semiconductor devices 10 and 10-*l* to 10-*m* on a wafer. Since the number of wirings between the burn-in test apparatus 30 and the semiconductor devices 10 and 10-*l* to 10-*m* is reduced, more semiconductor devices are testable in a single burn-in test. Namely, the throughput of the test is improved. In addition, since a power supply apparatus that is only able to output the voltage vcc_burnin needs to be prepared for the burn-in test apparatus 30, cost reduction is achieved for the burn-in test apparatus 30.

Figure 8:
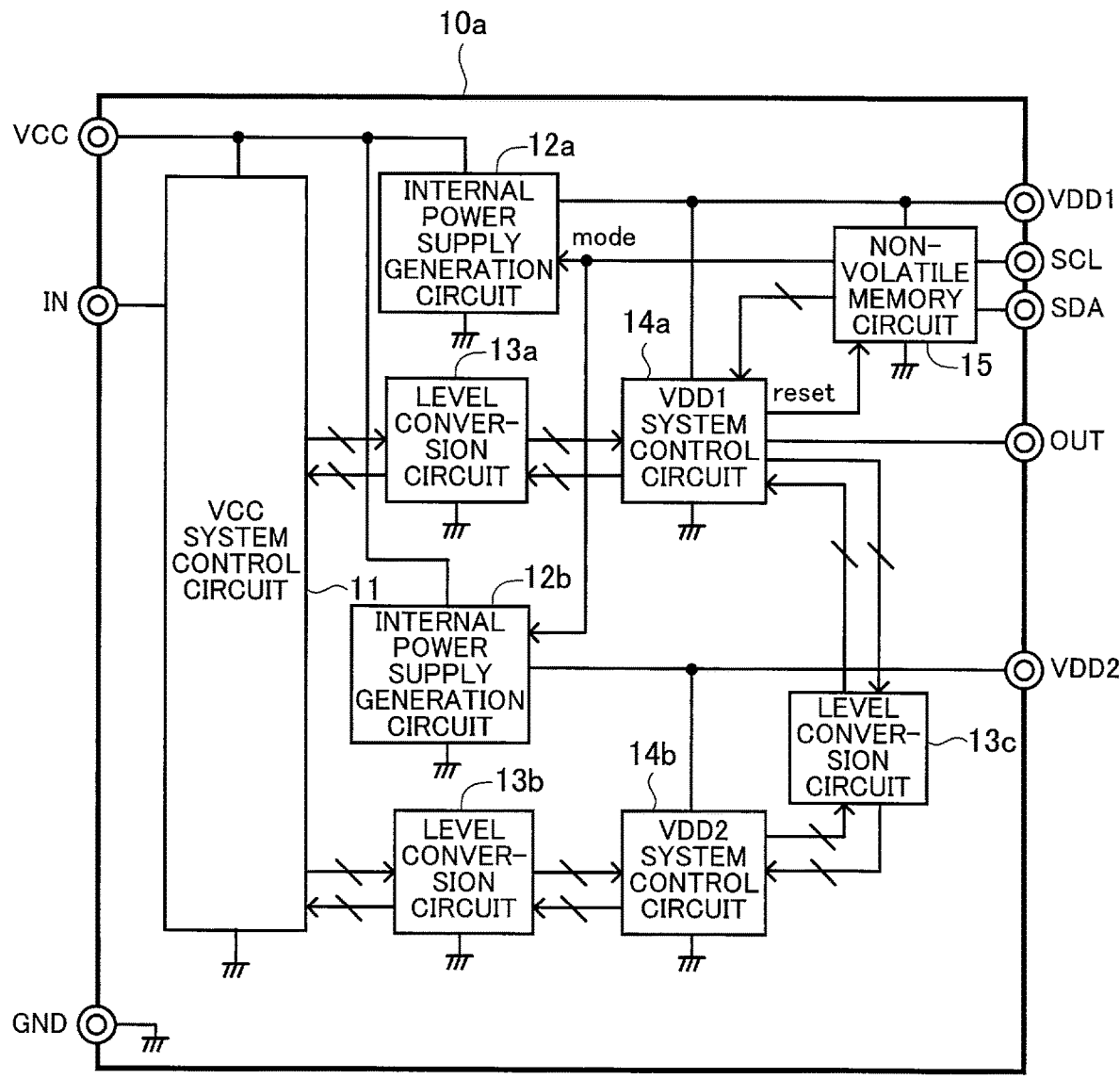
FIG. 8 is a block diagram illustrating a configuration example of a semiconductor device according to a second embodiment.

FIG. 8 is a block diagram illustrating a configuration example of a semiconductor device according to a second embodiment. In FIG. 8, elements that are the same as or equivalent to those in FIG. 1 will be denoted by the same reference characters, and detailed description thereof will be omitted.

A semiconductor device 10a according to the second embodiment has a circuit configuration that operates with three power supply voltages VCC, VDD1, and VDD2. Namely, the semiconductor device 10a includes an internal power supply generation circuit 12a that generates the voltage VDD1 from the voltage VCC, an internal power supply generation circuit 12b that generates the voltage VDD2, a VDD1 system control circuit 14a that operates with the voltage VDD1, and a VDD2 system control circuit 14b that operates with the voltage VDD2. The voltage VDD1 generated by the internal power supply generation circuit 12a is outputted to a VDD1 terminal, and the voltage VDD2 generated by the internal power supply generation circuit 12b is outputted to a VDD2 terminal.

The semiconductor device 10a also includes a level conversion circuit 13a that performs level conversion between the VCC system control circuit 11 and the VDD1 system control circuit 14a, a level conversion circuit 13b that performs level conversion between the VCC system control circuit 11 and the VDD2 system control circuit 14b, and a level conversion circuit 13c that performs level conversion between the VDD1 system control circuit 14a and the VDD2 system control circuit 14b.

In this semiconductor device 10a, the externally supplied voltage VCC is, for example, 5 V, and the internally generated voltages VDD1 and voltage VDD2 are, for example, 3.3 V and 1.8 V, respectively.

In this semiconductor device 10a, too, prior to a burn-in test, a mode signal mode indicating a burn-in mode is previously written in a non-volatile memory circuit 15. In the burn-in test, by reading the mode signal mode previously set in the non-volatile memory circuit 15, the internal power supply generation circuit 12a generates a burn-in voltage higher than 3.3 V, and the internal power supply generation circuit 12b generates a burn-in voltage higher than 1.8 V. After the burn-in test, the mode signal mode in the non-volatile memory circuit 15 is rewritten to the normal mode.

Figure 9:
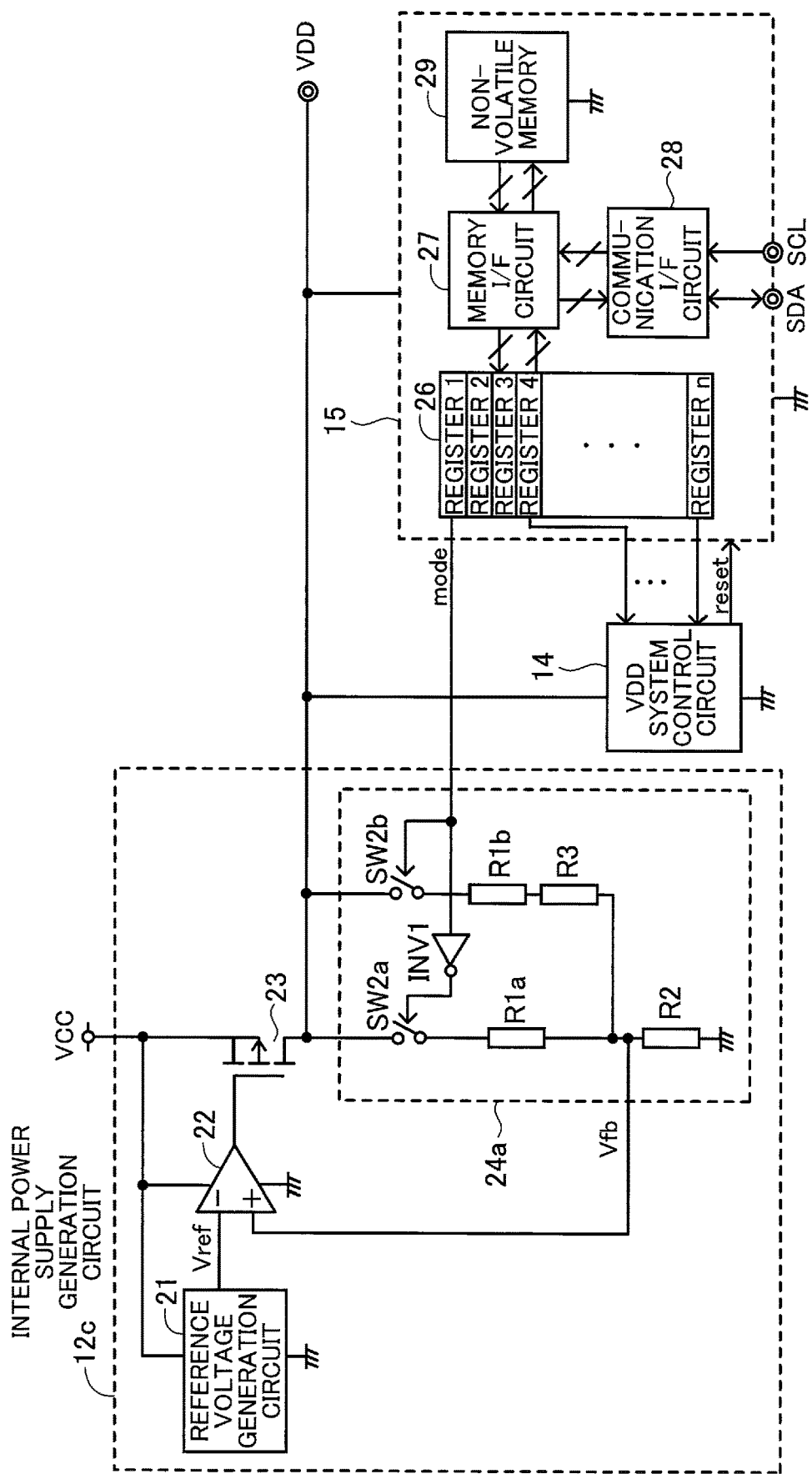
FIG. 9 is a circuit diagram illustrating specific configuration examples of an internal power supply generation circuit and a non-volatile memory circuit in a semiconductor device according to a third embodiment.

FIG. 9 is a circuit diagram illustrating specific configuration examples of an internal power supply generation circuit and a non-volatile memory circuit in a semiconductor device according to a third embodiment. In FIG. 9, elements that are the same as or equivalent to those in FIG. 5 will be denoted by the same reference characters, and detailed description thereof will be omitted.

The semiconductor device according to the third embodiment includes an internal power supply generation circuit 12c in place of the internal power supply generation circuit 12 of the semiconductor device 10 according to the first embodiment. The internal power supply generation circuit 12c includes a reference voltage generation circuit 21, an error amplifier 22, an output transistor 23, and an internal power supply voltage setting circuit 24a.

The internal power supply voltage setting circuit 24a includes resistors R1a, R1b, R2, and R3, switches SW2a and SW2b, and an inverter circuit INV1. One terminal of the switch SW2a is connected to the drain of the output transistor 23 and a VDD terminal, and the other terminal of the switch SW2a is connected to one terminal of the resistor R1a. The other terminal of the resistor R1a is connected to one terminal of the resistor R2 and the non-inverting input terminal of the error amplifier 22. The other terminal of the resistor R2 is connected to ground. One terminal of the switch SW2b is connected to the drain of the output transistor 23 and the VDD terminal, and the other terminal of the switch SW2b is connected to one terminal of the resistor R1b. The other terminal of the resistor R1b is connected to one terminal of the resistor R3. The other terminal of the resistor R3 is connected to the other terminal of the resistor R1a, one terminal of the resistor R2, and the non-inverting input terminal of the error amplifier 22. In this way, the resistors R1a and R2 form a first voltage-dividing circuit, the resistors R1b, R2, and R3 form a second voltage-dividing circuit. The first and second voltage-dividing circuits are complementarily enabled by the switches SW2a and SW2b. The control input terminal of the switch SW2a is connected to the output terminal of the inverter circuit INV1, the input terminal of the inverter circuit INV1 and the control input terminal of the switch SW2b are connected to the output of a register 1 of a register circuit 26. Each of the resistors R1a and R1b is the same as the resistor R1 in the internal power supply voltage setting circuit 24 in FIG. 5, and the resistors R2 and R3 are the same as the resistors R2 and R3 in the internal power supply voltage setting circuit 24 in FIG. 5.

With this internal power supply voltage setting circuit 24a, a mode signal mode outputted by the register 1 of the register circuit 26 is an "L" level in a normal mode. Thus, in this case, the switch SW2a is set in a closed state, and the switch SW2b is set in an open state.

In contrast, in a burn-in mode, the mode signal mode outputted by the register 1 of the register circuit 26 is an "H" level. Thus, in this case, the switch SW2a is set in the open state, and the switch SW2b is set in the closed state.

Thus, a feedback voltage Vfb in the normal mode is determined by the voltage division ratio based on the value of the resistor R1a and the value of the resistor R2, and the feedback voltage Vfb in the burn-in mode is determined by the voltage division ratio based on the sum of the values of the resistors R1b and R3 and the value of the resistor R2. Since the voltage division ratio in the burn-in mode is smaller than the voltage division ratio in the normal mode, the voltage VDD in the burn-in mode becomes higher than the voltage VDD in the normal mode.

While the configuration of the internal power supply voltage setting circuit 24a in the semiconductor device according to the third embodiment differs from that of the internal power supply voltage setting circuit 24 in the semiconductor device 10 according to the first embodiment, these internal power supply voltage setting circuits 24a and 24 operate in the same way in the normal mode and the burn-in mode. Thus, the semiconductor device according to the third embodiment operates in the same way as the semiconductor device 10 according to the first embodiment.

Figure 10:
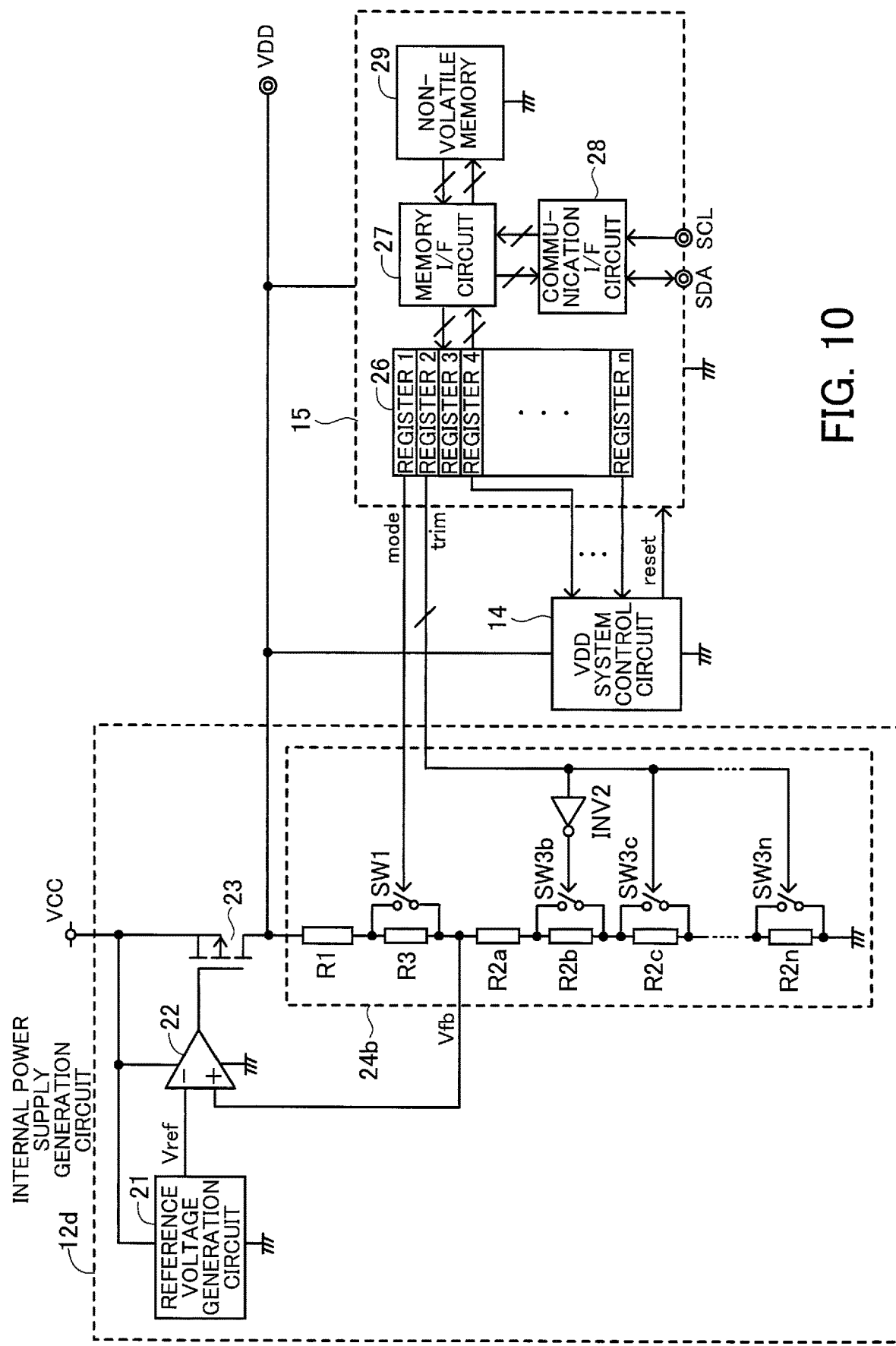
FIG. 10 is a circuit diagram illustrating specific configuration examples of an internal power supply generation circuit and a non-volatile memory circuit in a semiconductor device according to a fourth embodiment.
Figure 11:
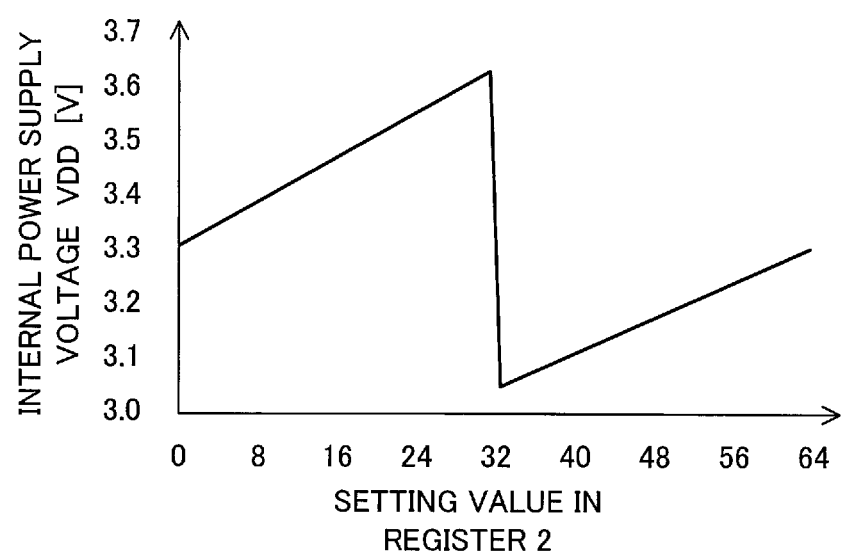
FIG. 11 illustrates a relationship between an internal power supply voltage and a setting value in a trim signal stored in the non-volatile memory circuit.

FIG. 10 is a circuit diagram illustrating specific configuration examples of an internal power supply generation circuit and a non-volatile memory circuit in a semiconductor device according to a fourth embodiment. FIG. 11 illustrates a relationship between an internal power supply voltage and a setting value in a trim signal stored in the non-volatile memory circuit. In FIG. 10, elements that are the same as or equivalent to those in FIG. 5 will be denoted by the same reference characters, and detailed description thereof will be omitted.

The semiconductor device according to the fourth embodiment includes an internal power supply generation circuit 12d in place of the internal power supply generation circuit 12 of the semiconductor device 10 according to the first embodiment. The internal power supply generation circuit 12d includes a reference voltage generation circuit 21, an error amplifier 22, an output transistor 23, and an internal power supply voltage setting circuit 24b.

The internal power supply voltage setting circuit 24b includes resistors R1, R2a to R2n, and R3, switches SW1 and SW3b to SW3n, and an inverter circuit INV2. The resistors R2a to R2n are adjusting resistors obtained by dividing the resistor R2 in FIG. 5 into a plurality of resistors, and the switches SW3b to SW3n are resistance value adjustment switches. The resistors R1, R2a to R2n, and R3 are connected in series with each other. One terminal of the resistor R1 is connected to the drain of the output transistor 23 and a VDD terminal, and the other terminal of the resistor R2n is connected to ground. The switch SW1 is connected in parallel to the resistor R3, and the switches SW3b to SW3n are connected in parallel to the resistors R2b to R2n, respectively. The switch SW1 has a control input terminal connected to the output of a register 1 of a register circuit 26. In this way, the switch SW1 is switched on and off by a mode signal mode. The switch SW3b has a control input terminal connected to the output terminal of the inverter circuit INV2. The input terminal of the inverter circuit INV2 and the control input terminals of the switches SW3c to SW3n are connected to the output of a register 2 of the register circuit 26. The register 2 outputs a trim signal trim and controls on and off of the switches SW3b to SW3n.

The resistors R1 and R3 are the same as the resistance values of the resistors R1 and R3 in the internal power supply voltage setting circuit 24 in FIG. 5. The total resistance value of the resistors R2a to R2n is the same as the resistance value of the resistor R2 in the internal power supply voltage setting circuit 24 in FIG. 5. In this way, the voltage division ratio that determines a feedback voltage Vfb is changed by changing the combination of switches SW3b to SW3n that are switched on and off and changing the total resistance value of the resistors R2a to R2n. Thus, the internal power supply generation circuit 12d enables fine adjustment on the values of the feedback voltage Vfb and the voltage VDD accurately. In a preferable embodiment, the number of switches SW3b to SW3n connected to the resistors R2b to R2n in the internal power supply voltage setting circuit 24b is 6, and a 6-bit trim signal trim is stored in the register 2 in the register circuit 26. Thus, since there are 64 combinations of switches SW3b to SW3n that are switched on and off based on the resistors R2a to R2n, the voltage VDD is finely adjusted.

This fine adjustment of the voltage VDD is performed when a wafer test apparatus sets a non-volatile memory circuit 15 to a normal mode and performs a final test prior to product delivery in steps S6 and S7 in FIG. 2. The wafer test apparatus has data that indicates a relationship between the internal power supply voltage and a setting value in the register 2 as illustrated in FIG. and performs the fine adjustment of the voltage VDD based on this data and the voltage VDD at the VDD terminal measured by a characteristics test after a burn-in test.

Specifically, in this characteristics test after the burn-in test, since a 6-bit value "000000" is stored in the register 2 of the register circuit 26, the internal power supply voltage when the switches SW3b to SW3n are controlled by the trim signal trim, the internal power supply generation circuit 12d generates about 3.3 V as the voltage VDD.

In this case, if the measured voltage VDD at the VDD terminal is not 3.3 V, which is the target voltage, the wafer test apparatus sets a value "1" in any one of the bits of the register 2 of the register circuit 26 via the communication interface circuit 28 and the memory interface circuit 27. Next, the wafer test apparatus determines whether the measured voltage VDD at the VDD terminal is the target voltage 3.3 V. If the voltage VDD at the VDD terminal is the target voltage, the wafer test apparatus stores the value of the register 2 in the non-volatile memory 29.

When the measured voltage VDD at the VDD terminal is not the target voltage, the wafer test apparatus repeats incrementing a value of the register 2 of the register circuit 26 to and measuring the voltage VDD at the VDD terminal until the measured voltage VDD becomes closest to the target voltage.

This fine adjustment of the voltage VDD is also applicable to the fine adjustment of a VDD burn-in voltage when the wafer test apparatus sets a burn-in mode in the non-volatile memory circuit 15. In this case, the wafer test apparatus repeatedly performs the fine adjustment in steps S6 and S7 in FIG. 2 until the VDD burn-in voltage reaches the corresponding target voltage. If the measured VDD burn-in voltage has reached the target voltage, the value set in the register 2 of the register circuit 26 is stored in the non-volatile memory 29.

Figure 12:
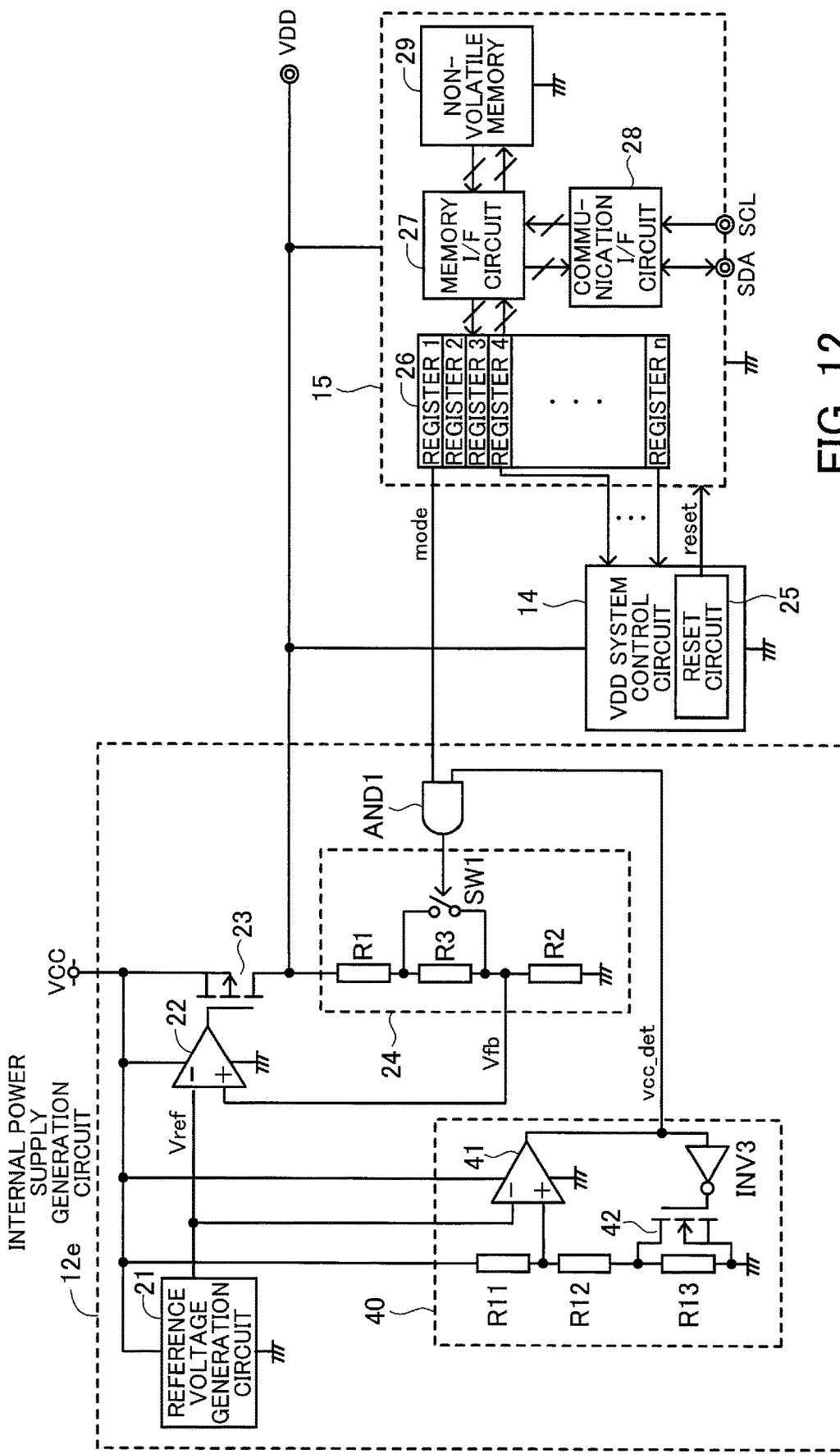
FIG. 12 is a circuit diagram illustrating specific configuration examples of an internal power supply generation circuit and a non-volatile memory circuit in a semiconductor device according to a fifth embodiment.
Figure 13:
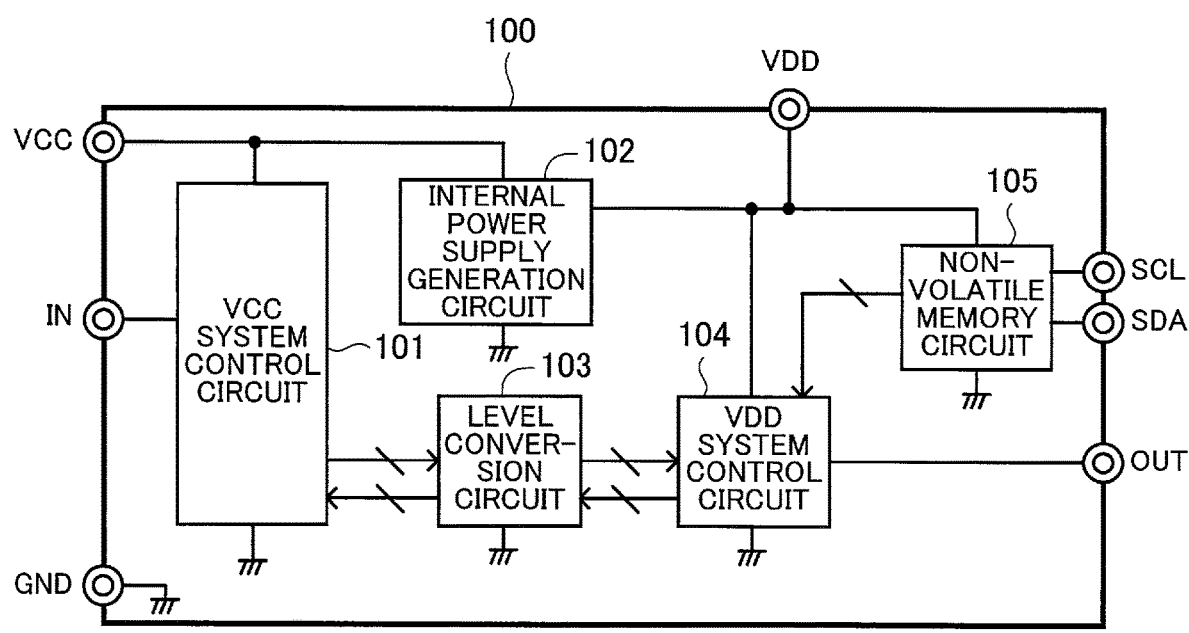
FIG. 13 is a block diagram illustrating a configuration example of a general semiconductor device including circuits that operate with different power supply voltages.

FIG. 12 is a circuit diagram illustrating specific configurations of an internal power supply generation circuit and a non-volatile memory circuit in a semiconductor device according to a fifth embodiment. In FIG. 12, elements that are the same as or equivalent to those in FIG. 5 will be denoted by the same reference characters, and detailed description thereof will be omitted.

A semiconductor device according to a fifth embodiment includes an internal power supply generation circuit 12e in place of the internal power supply generation circuit 12 of the semiconductor device 10 according to the first embodiment. Specifically, the internal power supply generation circuit 12e includes an external power supply voltage detection circuit 40 and an AND circuit AND1, in addition to the elements included in the internal power supply generation circuit 12. Configured in this way, the internal power supply generation circuit 12e is able to set an internal power supply voltage VDD based on data stored in a non-volatile memory 29 and an external power supply voltage VCC.

The external power supply voltage detection circuit 40 includes resistors R11 to R13 that form a resistive voltage-dividing circuit, a comparator 41, a transistor 42 serving as a switch element, and an inverter circuit INV3. In FIG. 12, an N-channel MOSFET is used as the transistor 42. One terminal of the resistor R11 is connected to a VCC terminal, and the other terminal of the resistor R11 is connected to one terminal of the resistor R12 and the non-inverting input terminal of the comparator 41. The other terminal of the resistor R12 is connected to one terminal of the resistor R13 and the drain of the transistor 42. The other terminal of the resistor R13 and the source of the transistor 42 are connected to ground. The inverting input terminal of the comparator 41 is connected to the output terminal of the reference voltage generation circuit 21, and the output terminal of the comparator 41 is connected to the input terminal of the inverter circuit INV3 and one input terminal of the AND circuit AND1. The output terminal of the inverter circuit INV3 is connected to the gate of the transistor 42.

The other input terminal of the AND circuit AND1 is connected to the output of a register 1 of a register circuit 26, and the output terminal of the AND circuit AND1 is connected to the control input terminal of a switch SW1.

The comparator 41 in the external power supply voltage detection circuit 40 compares a reference voltage Vref outputted by the reference voltage generation circuit 21 with a voltage obtained by dividing the external power supply voltage VCC by the resistors R11 to R13. The values of the resistors R11 to R13 are set to satisfy VCC·R12/(R11+R12) <Vref in a normal mode (VCC=5 V) and VCC·(R12+R13)/(R11+R12+R13)>Vref in a burn-in mode (VCC=7.8 V).

Thus, since the output of the comparator 41 is an "L" level in the normal mode, the external power supply voltage detection circuit 40 outputs an "L" level signal vcc_det. In this case, since the inverter circuit INV3 outputs an "H" level signal, the transistor 42 is set to on and short-circuits the resistor R13. Thus, a voltage obtained by VCC·R12/(R11+R12), corresponding to a low voltage division ratio, is inputted to the non-inverting input terminal of the comparator 41.

In contrast, in the burn-in mode, since the output of the comparator 41 is an "H" level, the external power supply voltage detection circuit 40 outputs an "H" level signal vcc_det. In this case, the inverter circuit INV3 outputs an "L" level signal and the transistor 42 is set to off. Thus, a voltage obtained by VCC·(R12+R13)/(R11+R12+R13), corresponding to a high voltage division ratio, is inputted to the non-inverting input terminal of the comparator 41.

In the normal mode in which the external power supply voltage detection circuit 40 outputs the "L" level signal vcc_det, the "L" level signal is inputted to one input terminal of the AND circuit AND1. Thus, since a mode signal mode inputted to the other input terminal of the AND circuit AND1 is disabled, the AND circuit AND1 outputs an "L" level signal, and the switch SW1 is set to the closed state in the normal mode. Namely, even when an unintended burn-in mode is set in the non-volatile memory 29, as long as the external power supply voltage detection circuit 40 is outputting the "L" level signal vcc_det, the internal power supply voltage setting circuit 24 is not set in the burn-in mode.

In the burn-in mode in which the external power supply voltage detection circuit 40 outputs the "H" level signal vcc_det, the "H" level signal is inputted to one input terminal of the AND circuit AND1. Thus, the AND circuit AND1 enables the mode signal mode inputted to the other input terminal thereof. In the burn-in mode, since the mode signal mode is an "H" level signal, the AND circuit AND1 outputs an "H" level signal, and the switch SW1 is set to an open state.

With this internal power supply generation circuit 12e, the switch SW1 that switches the value of the voltage VDD is opened or closed based on the logical AND of the value of the mode signal mode outputted by the register 1 in the register circuit 26 and the value of the signal vcc_det outputted by the external power supply voltage detection circuit 40. In this way, the internal power supply generation circuit 12e receives the mode signal mode only when a voltage vcc_burnin in the burn-in mode is applied to the VCC terminal of the semiconductor device 10. For example, if writing of the non-volatile memory 29 to the normal mode fails in the burn-in test of the semiconductor device previously performed, there are cases in which the excessive burn-in mode voltage vdd_burnin is applied to the VDD system control circuit 14 even in the normal mode. However, the present embodiment avoids these cases. Thus, the internal power supply generation circuit 12e avoids shortening the lifespans of elements constituting the VDD system control circuit 14 and the non-volatile memory circuit 15 or avoids breakdown of these elements.

The external power supply voltage detection circuit 40 and the AND circuit AND1 in the internal power supply generation circuit 12e may be applied in the same way to the internal power supply generation circuit 12c illustrated in FIG. 9 and the internal power supply generation circuit 12d illustrated in FIG. 10.

The above test method is performed when the burn-in test is performed on a wafer. However, as long as the mode signal mode stored in the non-volatile memory circuit 15 is rewritable, the test method is applicable in the same way to cases in which semiconductor devices are incorporated in containers after an assembly process.

In the case of an individual semiconductor device having the above configuration and the test method thereof, since a test voltage that has conventionally been given from the outside is generated inside the semiconductor device, a fewer number of test terminals is needed. In addition, since the number of wirings connected to the individual semiconductor device is reduced, there is an advantage in that the test apparatus is able to test more semiconductor devices in a single test.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device having an external power supply terminal, the semiconductor device comprising:
    an internal power supply generation circuit configured to generate an internal power supply voltage from the external power supply voltage applied to an external power supply terminal; and
    a non-volatile memory circuit configured to store therein data rewritable externally, wherein
    the internal power supply generation circuit sets the internal power supply voltage based on the data stored in the non-volatile memory circuit.

2. The semiconductor device according to claim 1,
    wherein the data indicates a normal mode or a burn-in mode,
    wherein, in response to the data indicating the normal mode, the internal power supply generation circuit sets the internal power supply voltage to a normal operation voltage, and
    wherein, in response to the data indicating the burn-in mode, the internal power supply generation circuit sets the internal power supply voltage to a burn-in voltage higher than the normal operation voltage.

3. The semiconductor device according to claim 2, wherein the internal power supply generation circuit sets the internal power supply voltage based on the data and a value of the external power supply voltage.

4. The semiconductor device according to claim 2, wherein the non-volatile memory circuit includes a non-volatile memory configured to hold the data, a memory interface circuit configured to control the non-volatile memory, and a register circuit configured to hold the data read from the non-volatile memory by the memory interface circuit.

5. The semiconductor device according to claim 4, further comprising a reset circuit configured to output a reset signal in response to the external power supply voltage being applied to start the semiconductor device and to cancel the reset signal after the internal power supply generation circuit outputs a voltage having a voltage level greater than a predetermined voltage level,
    wherein the non-volatile memory circuit starts an operation in response to the reset signal being canceled, and the memory interface circuit causes the register circuit to hold the data stored in the non-volatile memory.

6. The semiconductor device according to claim 2, wherein the internal power supply generation circuit includes a plurality of power supply generation circuits configured to generate different power supply voltages.

7. The semiconductor device according to claim 2, wherein the internal power supply generation circuit includes an error amplifier configured to receive a reference voltage and a feedback voltage, an output transistor configured to be controlled by the error amplifier to control an output voltage of the internal power supply generation circuit, and an internal power supply voltage setting circuit configured to divide the output voltage and output the feedback voltage.

8. The semiconductor device according to claim 7, wherein the internal power supply voltage setting circuit includes
    a voltage-dividing circuit including a plurality of series-connected resistors, the voltage-dividing circuit being configured to divide the output voltage and
    a switch connected in parallel to at least one of the resistors and configured to be opened or closed by the data.

9. The semiconductor device according to claim 8, wherein the internal power supply generation circuit includes
    an external power supply voltage detection circuit configured to detect the external power supply voltage and determine whether the external power supply voltage is in the normal mode or in the burn-in mode, and
    an AND circuit configured to enable the data only in response to determination by the external power supply voltage detection circuit that the external power supply voltage is in the burn-in mode.

10. The semiconductor device according to claim 9, wherein the external power supply voltage detection circuit includes
    a resistive voltage-dividing circuit configured to divide the external power supply voltage and output a detection voltage,
    a comparator configured to compare the reference voltage with the detection voltage and output an enabling signal in response to the detection voltage being higher than the reference voltage, and
    a switch element configured to set, upon receiving the enabling signal, a voltage division ratio of the resistive voltage-dividing circuit to be higher than a voltage division ratio corresponding to when the switch element does not receive the enabling signal.

11. The semiconductor device according to claim 7, wherein the internal power supply voltage setting circuit includes a first voltage-dividing circuit configured to divide the output voltage by a first voltage division ratio, a second voltage-dividing circuit configured to divide the output voltage by a second voltage division ratio that is different from the first voltage division ratio, a first switch connected in series with the first voltage-dividing circuit, and a second switch connected in series with the second voltage-dividing circuit, the first and second switches being opened or closed complementarily by the data.

12. The semiconductor device according to claim 8, wherein the data includes first data and second data stored at different location, and the internal power supply voltage setting circuit includes a plurality of adjusting resistors obtained by dividing one of the series-connected resistors, and a plurality of resistance value adjustment switches connected respectively in parallel to the plurality of adjusting resistors, wherein the resistance value adjustment switches are opened or closed by the second data.

13. The semiconductor device according to claim 1, further comprising an internal power supply terminal connected to an output terminal of the internal power supply generation circuit and configured to output the internal power supply voltage externally.

14. A semiconductor device having an external power supply terminal, the semiconductor device comprising:

an internal power supply generation circuit configured to generate an internal power supply voltage from the external power supply voltage applied to an external power supply terminal; and a non-volatile memory circuit configured to store therein data rewritable externally, wherein, in response to the data indicating a first mode, the internal power supply generation circuit sets the internal power supply voltage to a first voltage, and in response to the data indicating a second mode, the internal power supply generation circuit sets the internal power supply voltage to a second voltage different from the first voltage.

\* \* \* \* \*